(12) United States Patent
Postlewaite

(10) Patent No.: US 10,930,421 B2
(45) Date of Patent: Feb. 23, 2021

(54) METHOD OF TUNING AN INDUCTANCE OF AN INDUCTIVE SENSOR

(71) Applicant: Simmonds Precision Products, Inc., Vergennes, VT (US)

(72) Inventor: Sean Postlewaite, Charlotte, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 16/436,275

(22) Filed: Jun. 10, 2019

(65) Prior Publication Data

US 2019/0295759 A1  Sep. 26, 2019

Related U.S. Application Data

(62) Division of application No. 15/599,001, filed on May 18, 2017, now Pat. No. 10,395,811.

(51) Int. Cl.
| | |
|---|---|
| *H01F 3/00* | (2006.01) |
| *H01F 41/02* | (2006.01) |
| *H01F 21/08* | (2006.01) |
| *H01F 21/06* | (2006.01) |
| *H01F 29/14* | (2006.01) |
| *H01B 1/02* | (2006.01) |
| *H01F 1/00* | (2006.01) |
| *H01F 1/28* | (2006.01) |
| *H03K 17/95* | (2006.01) |
| *H01F 5/00* | (2006.01) |

(52) U.S. Cl.
CPC .............. *H01F 21/08* (2013.01); *H01B 1/026* (2013.01); *H01F 1/0018* (2013.01); *H01F 1/28* (2013.01); *H01F 21/06* (2013.01); *H01F 29/146* (2013.01); *H03K 17/9505* (2013.01); *H01F 2005/006* (2013.01); *H03K 2217/9401* (2013.01)

(58) Field of Classification Search
CPC ........ H01F 21/08; H01F 21/06; H01F 29/146; H01F 1/28; H01F 1/0018; H01B 1/026; H03K 17/9505
See application file for complete search history.

(56) References Cited

U.S. PATENT DOCUMENTS

| | | |
|---|---|---|
| 3,609,615 A | 9/1971 | Parker et al. |
| 3,864,824 A | 2/1975 | Watson et al. |
| 6,529,008 B1 | 3/2003 | Mohamed |
| 6,703,830 B2 | 3/2004 | Kaste |
| 6,992,557 B2 * | 1/2006 | Aoyagi ............... H01F 17/0033 336/200 |

(Continued)

FOREIGN PATENT DOCUMENTS

| | | |
|---|---|---|
| JP | H0555040 A | 3/1993 |
| JP | H09123449 A | 5/1997 |

OTHER PUBLICATIONS

Extended European Search Report for EP Application No. 18171176.3, dated Oct. 2, 2018, 8 pages.

(Continued)

*Primary Examiner* — Paul D Kim
(74) *Attorney, Agent, or Firm* — Kinney & Lange, P.A.

(57) ABSTRACT

An inductive sensor includes a core body, a coil wound on the core body, a cavity having a fixed volume within the core body, and an epoxy mixture filling a controlled portion of the fixed volume. The controlled portion of the fixed volume filled with the epoxy mixture controls an inductance of the sensor.

7 Claims, 4 Drawing Sheets

(56) References Cited

U.S. PATENT DOCUMENTS

| | | | |
|---|---|---|---|
| 8,610,530 B2* | 12/2013 | Singh | A61N 1/0553 336/200 |
| 10,229,779 B2* | 3/2019 | Harber | H01F 27/266 |
| 2004/0124961 A1* | 7/2004 | Aoyagi | H01F 17/0033 336/200 |
| 2005/0070143 A1 | 3/2005 | Eriksson et al. | |
| 2013/0182460 A1 | 7/2013 | Marusawa et al. | |
| 2013/0199027 A1* | 8/2013 | Singh | H02J 17/00 29/602.1 |
| 2013/0328656 A1 | 12/2013 | Sakamoto | |
| 2014/0259643 A1* | 9/2014 | Marcoci | H01F 41/046 29/607 |
| 2015/0348695 A1 | 12/2015 | Kostelnik et al. | |
| 2016/0276088 A1 | 9/2016 | Kwon et al. | |
| 2017/0011836 A1 | 1/2017 | Ma et al. | |

OTHER PUBLICATIONS

Communication Pursuant to Article 94(3) EPC for EP Application No. 18171176.3, dated Jun. 30, 2020, 8 pages.

\* cited by examiner

METHOD OF TUNING AN INDUCTANCE OF AN INDUCTIVE SENSOR

CROSS-REFERENCE TO RELATED APPLICATION(S)

This application is a divisional of U.S. application Ser. No. 15/599,001, filed May 18, 2017, now U.S. Pat. No. 10,395,811, for "INDUCTIVE SENSOR TUNING USING A PERMEABLE PASTE MIXTURE" by S. Postlewaite.

BACKGROUND

Inductive proximity sensors detect the presence of ferromagnetic and paramagnetic objects within a threshold distance, and are commonly used in the aerospace industry. On an aircraft, proximity sensors can be used to monitor and ensure proper positioning of moving components, such as doors, hatches, and landing gear.

Inductive proximity sensors must often be calibrated to achieve the inductance value required for the specific application. Existing sensors are typically calibrated using a metallic tuning screw, which is turned into the inductor core of the sensor to adjust the final inductance of the sensor. One issue with the use of tuning screws is that the low-tolerance designs required for certain environments are expensive, due to increased material and manufacturing costs. Another issue with tuning screw calibration is that it can be labor intensive, and the screw is vulnerable to shifting from its final position as it is being handled. Therefore, the need exists for an alternative means of calibration that is cost effective, customizable, and durable.

SUMMARY

An inductive sensor includes a core body, a coil wound on the core body, a cavity having a fixed volume within the core body, and an epoxy mixture filling a controlled portion of the fixed volume. The controlled portion of the fixed volume filled with the epoxy mixture controls an inductance of the sensor.

A method of tuning an inductance of an inductive sensor includes filling a core body cavity having a fixed volume with an epoxy mixture. The epoxy mixture includes an epoxy material and a magnetic material, and fills a controlled portion of the fixed volume. The controlled portion controls the inductance of the sensor.

DETAILED DESCRIPTION

The present invention is directed to an inductive proximity sensor. The sensor's final inductance can be adjusted by filling a cavity in the inductor core with a tuning paste-a mixture of epoxy and a magnetic material. Different inductance values can be achieved by varying the composition of the paste, and/or the amount of paste injected into the cavity.

Figure 1:
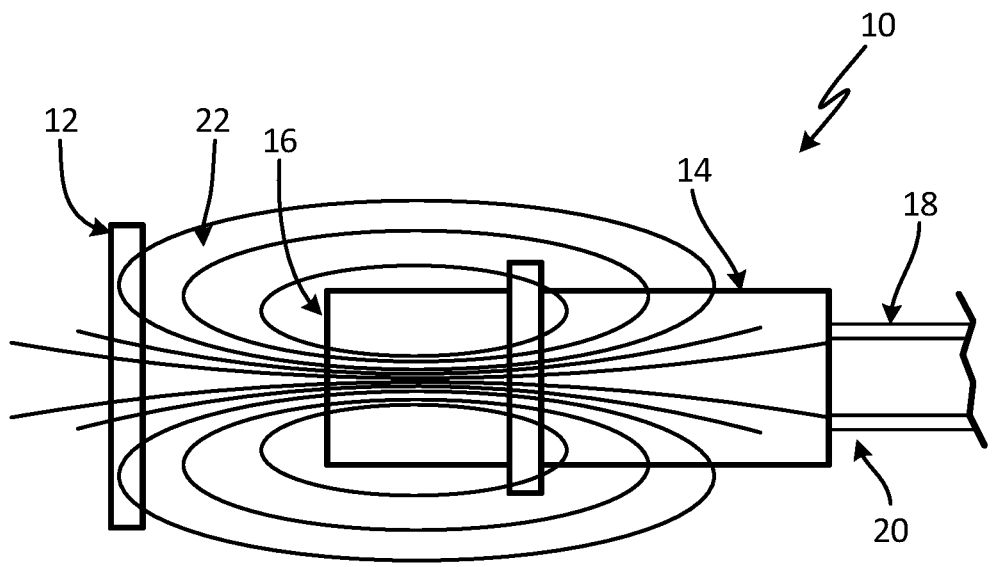
FIG. 1 is a simplified side-view of an inductive sensor and a target.

FIG. 1 is a simplified illustration of inductive proximity sensor 10, suitable for non-contact detection of target 12. Target 12 can be a metallic material, such as a ferrous or non-ferrous metal or alloy. Sensor 10 includes sensor housing 14, active face 16, wire 18, and output 20. In operation, current supplied through wire 18 by a power source (not shown) generates an electromagnetic field in a metallic coil (discussed in detail below) to form sensing region 22. The relative size and shape of electromagnetic field/sensing region 22 can differ from what is shown in FIG. 1, based on factors such as the configuration of sensor components and geometry. When target 12 is in sensing region 22, the electromagnetic field induces eddy currents in target 12. The eddy currents, in turn, reduce inductance of the coil. Detection circuitry within sensor 10 detects this change in inductance, and output circuitry subsequently outputs the detection signal through output 20. This signal can be converted into information, such as the distance between active face 16 and target 12. In the embodiment shown, wire 18 is configured to provide AC current to sensor 10, however, wire 18 can be configured to provide DC current, or AC/DC current in alternative embodiments.

Figure 2:
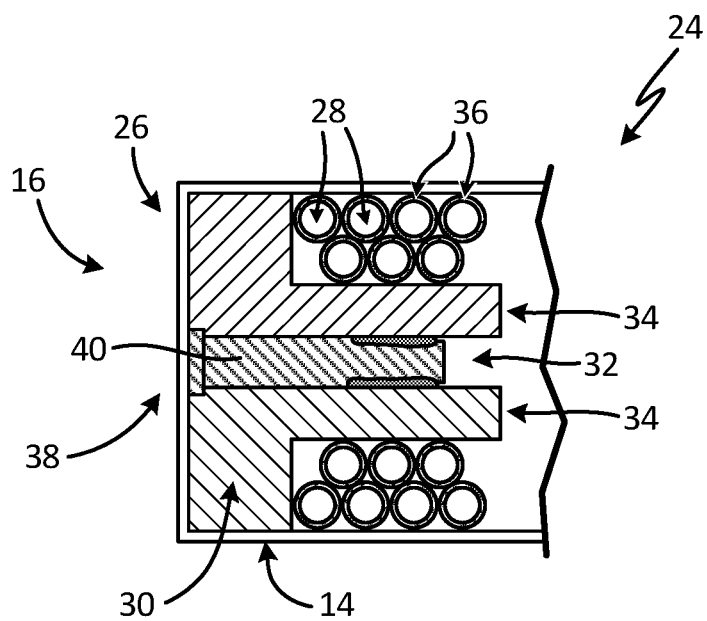
FIG. 2 is a cross-section of an inductive sensor having a prior art tuning screw.

FIG. 2 is an enlarged cross-section view of inductor assembly 24 of sensor 10, which is adjacent to active face 16. Inductor assembly 24 includes core assembly 26 and inductor coil 28. Core assembly 26 includes core body 30 and cavity 32. Body 30 can be formed from a magnetic material, such as iron, nickel, and cobalt, or their alloys. In the embodiment shown, body 30 includes leg portions 34, such that a cross-section of body 30 is generally "T" shaped, however, other suitable configurations ("U" shaped, square, etc.) are contemplated herein.

Coil 28 can be a wire, typically a magnet wire, formed from a conductive material such as pure copper, copper alloys, or having copper plating or cladding. Coil 28 can additionally be surrounded by insulating material 36. In other embodiments, coil 28 can be formed from a material such as nickel or silver. Coil 28 can be wound around body 30 for hundreds of turns, depending on the application and the inductance required. Alternative embodiments of sensor 10 can further include a plurality of coils.

Core assembly 26 further includes tuning member 38 disposed within cavity 32. In the embodiment of FIG. 2, tuning member 38 is a prior art tuning screw 40. To adjust the final inductance of sensor 10, tuning screw 40 is turned into cavity 32 until the desired inductance value is achieved. In the embodiment shown, tuning screw 40 is fully turned into cavity 32, such that its head is flush with the surface of body 30 at the side of active face 16. One issue with the use of tuning screw 40 is that the desired inductance value might not be achieved at any position of tuning screw 40 within cavity 32 (from partially inserted to fully inserted, as shown). In such a case, the operator must carefully readjust the position of tuning screw 40, or remove tuning screw 40 and attempt tuning with a different screw.

Figure 3A:
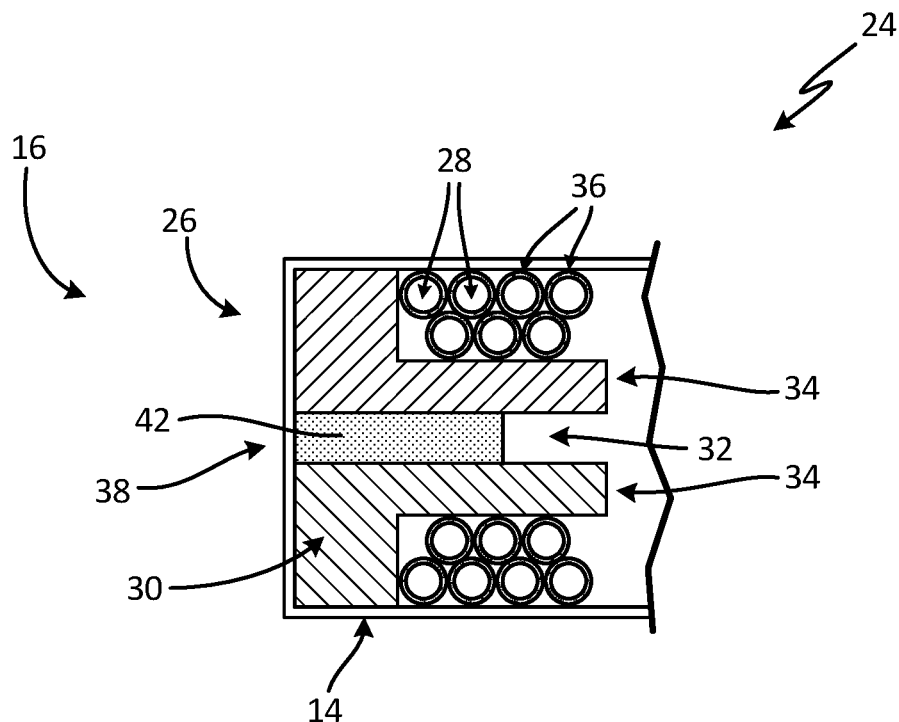
FIGS. 3A and 3B are cross-sections of an inductive sensor having tuning paste in the core cavity according to embodiments of the present invention.
Figure 3B:
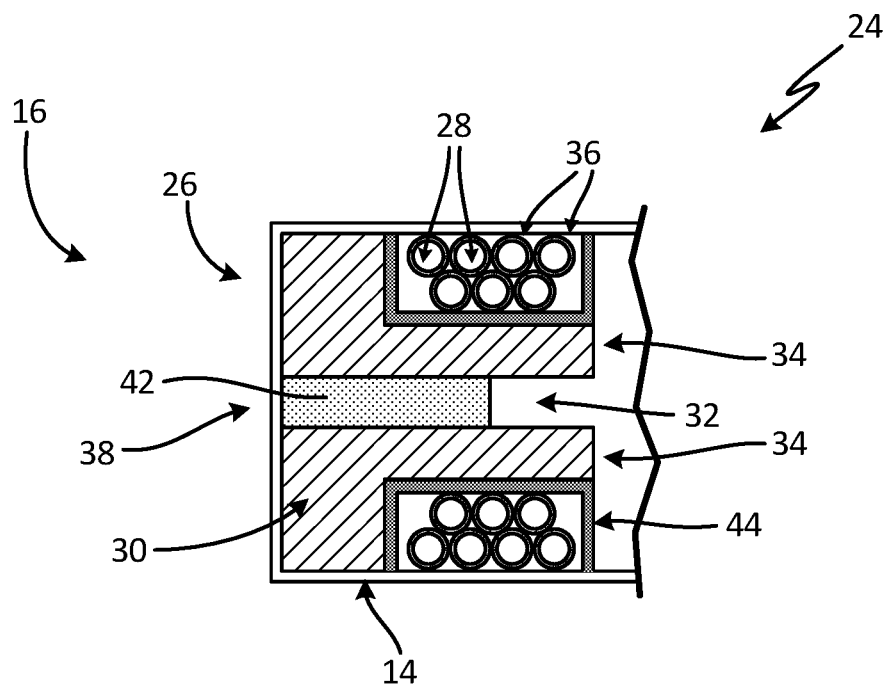

FIGS. 3A and 3B are enlarged cross-section views of inductor assembly 24 of sensor 10 according to embodiments of the present invention. In the embodiments shown, tuning member 38 is tuning paste 42. Tuning paste 42 is a mixture of an epoxy and a magnetic material. The magnetic material can be, for example, a soft magnetic material that is easily magnetized and demagnetized. Such materials include pure iron, iron-silicon alloys, and nickel-iron alloys, to name a few, non-limiting examples. Tuning paste 42 can alternatively include a paramagnetic material. The soft magnetic or paramagnetic material can be in particulate form, such as powder or beads, mixed into the epoxy paste. The soft magnetic or paramagnetic material can also be particles having any number of other geometric shapes, such as flakes or cubes. Tuning paste 42 can further be prepared such that it has a relatively low coefficient of thermal expansion (a), thus reducing the likelihood of detrimental expansion in high-temperature environments. In an exemplary embodiment, the coefficient of thermal expansion of tuning paste 42 is the same or similar to the value of that of body 30. In other embodiments, such a feature may not be necessary if the epoxy material is structurally weaker or more pliable than the material forming core body 30.

As shown in FIGS. 3A and 3B, coil 28 can be wound around leg portions 34 (FIG. 3A), and alternatively, coil 28 can be wound around and supported by bobbin 44 (FIG. 3B). Bobbin 44 can be formed from insulating material, such as plastic, phenolic, and glass, to name a few, non-limiting examples.

The inductance (L) of sensor 10 is determined by the number of turns (N) of coil 28 around core assembly 26, the area (A) and length (l) of coil 28, and the permeability ($\mu$) of core assembly 26, as represented by the equation: $L=\mu N^2 A/l$. Permeability ($\mu$) of core assembly 26 is equal to its relative permeability ($\mu_r$) multiplied by the permeability of free space ($\mu_o$). The incorporation of tuning paste 42 into core assembly 26 can affect the permeability ($\mu$) of core assembly 26, thereby altering the inductance (L) of inductor 24.

The permeability of the material forming body 30 is generally fixed, so tuning paste 42 can be used to alter the permeability of core assembly 26. One way to do this is to vary the composition of tuning paste 42. For example, tuning paste 42 having a lower epoxy content and/or a more permeable soft magnetic or paramagnetic material can be used to increase the permeability of core assembly 26, thus leading to an increase in inductance. A low-epoxy mixture also allows for finer tuning of sensor 10. Conversely, a tuning paste 42 having a higher epoxy content and/or less permeable soft magnetic or paramagnetic material can be used to decrease permeability and inductance values. A high-epoxy mixture allows for a coarser tuning range.

Figure 4A:
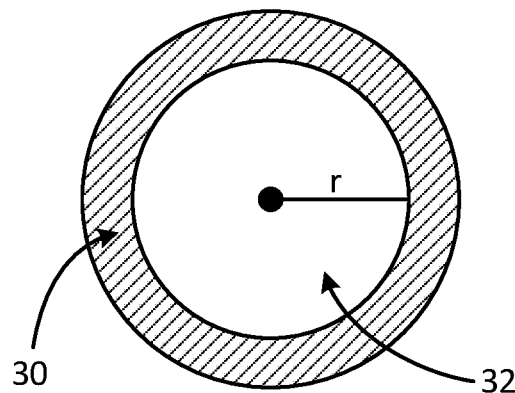
FIGS. 4A and 4B are front and side cross-sections, respectively, showing the dimensions of the sensor core cavity.
Figure 4B:
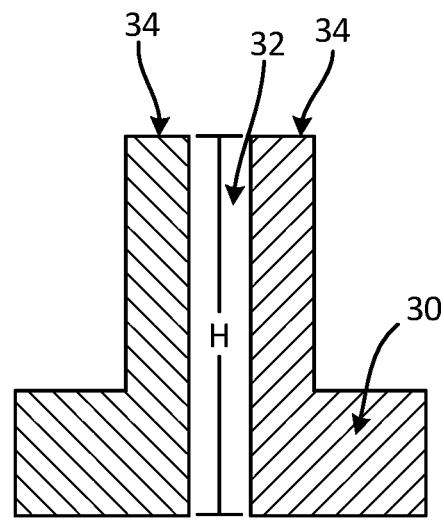
Figure 5A:
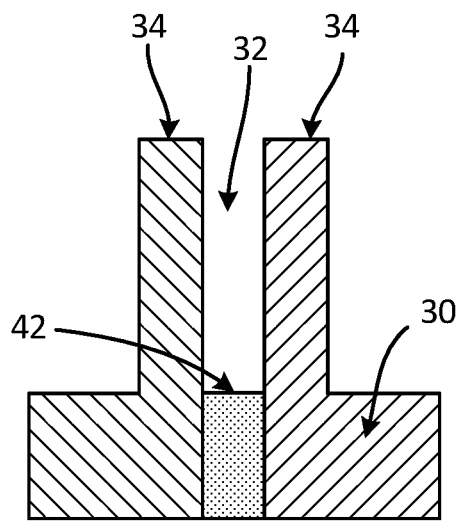
FIGS. 5A and 5B are cross-sections of the sensor core cavity filled with tuning paste according to alternative embodiments of the present invention.
Figure 5B:
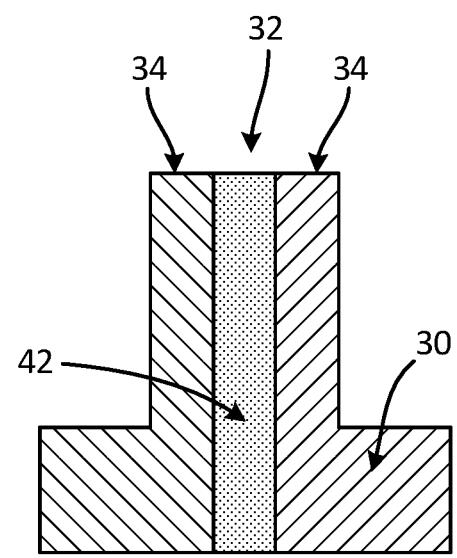

The inductance of sensor 10 can also be varied based on the amount of tuning paste 42 added to cavity 32. FIGS. 4A and 4B show a generally cylindrical cavity 32 having a radius (r) and a height (H). Tuning paste 42 can be injected, using a syringe or other appropriate tool, to fill a specific volume (V) (determined by $\pi r^2 * H$) based on the desired inductance value. In other embodiments, cavity 32 can have another shape, such as conical, cubical, hexagonal, and frustoconical, to name a few, non-limiting examples. In the embodiments of FIGS. 3A and 3B, tuning paste 42 fills roughly two-thirds of the volume of cavity 32. In the embodiments shown in FIGS. 5A and 5B, however, tuning paste 42 can fill anywhere from about twenty-five percent of cavity 32 (FIG. 5A) to about one hundred percent of cavity 32 (FIG. 5B). In other embodiments, tuning paste 42 may only fill ten percent of cavity 32. Other volumes ranging from about ten percent to about one hundred percent are also contemplated herein. The height of cavity 32 in the embodiments shown is generally equal that of body portion 30, however, it should be appreciated that the height can be less in other embodiments, such that cavity 32 does not extend the entire length of body portion 30.

Figure 6:
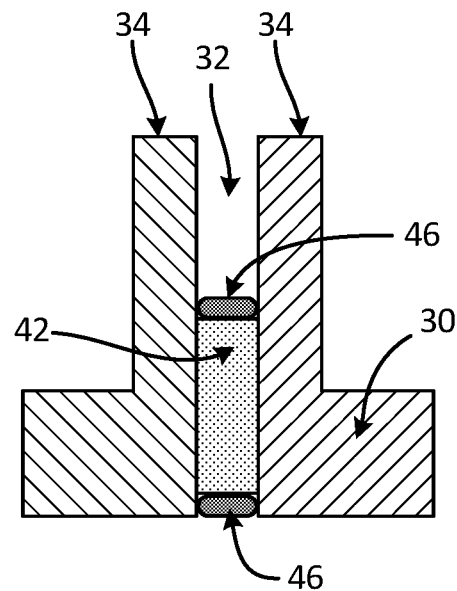
FIG. 6 is a cross-section of the sensor core according to yet another embodiment of the present invention.

In operation, tuning paste 42 is injected into cavity 32 until the desired inductance value is obtained. Tuning paste 42 is then allowed to set or cure, and can thereafter remain securely within cavity 32, with minimal risk of becoming dislodged or changing position. An additional measure to secure tuning paste within cavity 32 can be to apply a bead 46 of epoxy or another suitable sealant to one or both ends of cavity 32 near or in communication with tuning paste 42, as shown in FIG. 6. Using a sealant has the added benefit of preventing contamination of tuning paste 42 by foreign materials.

Figure 7:
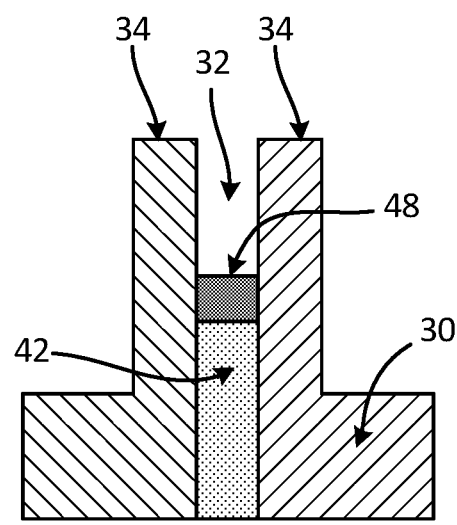
FIG. 7 is a cross-section of the sensor core according to yet another embodiment of the present invention.

It is further possible to adjust the inductance value of inductor 24, even after tuning paste 42 has been injected into cavity 32. In an embodiment where tuning paste 42 does not fill cavity 32 to capacity (e.g. FIGS. 3A, 3B, and 5A), additional tuning paste having either a similar or dissimilar composition can be added to cavity 32 to further adjust final inductance. If sensor 10 is "over tuned" such that the inductance value is too high after tuning paste 42 has set (and cannot be easily removed), it is possible to add mixture 48 containing diamagnetic material (a material repelled by a magnetic field) to cavity 32 to lower inductance. In the embodiment shown in FIG. 7, mixture 48 includes the diamagnetic material silver.

Sensor 10 with tuning paste 42 has several benefits. First, the epoxy mixture is generally less expensive than tuning screw 40. Labor costs can be reduced, since sensor 10 no longer requires the labor-intensive step of screw tuning. Sensor 10 can be made without threads in cavity 32, leading to lower production costs. Tuning paste 42 also presents a lower risk of detuning based on movement or dislodgment, unlike prior art tuning screws. This is particularly important in applications involving harsh environments.

Sensor 10 containing tuning paste 42 is also highly customizable. The epoxy mixture can be made on site, and tailored for many proximity sensing applications. The final inductance of sensor 10 can be adjusted in various ways, including through the composition of tuning paste 42, the volume of cavity 32 filled with tuning paste 42, and through the addition of more tuning paste 42 or other materials. Finally, sensor 10 can be used for a variety of proximity sensing applications, including those relevant to the transportation (aerospace, automotive, maritime, railway, etc.) industries, or generally for any application that involves sensing the position of a target material.

DISCUSSION OF POSSIBLE EMBODIMENTS

The following are non-exclusive descriptions of possible embodiments of the present invention.

An inductive sensor includes a core body, a coil wound on the core body, a cavity having a fixed volume within the core body, and an epoxy mixture filling a controlled portion of the fixed volume. The controlled portion of the fixed volume filled with the epoxy mixture controls an inductance of the sensor.

The sensor of the preceding paragraph can optionally include, additionally and/or alternatively, any one or more of the following features, configurations and/or additional components:

A bobbin supports the coil.

A wire is configured to provide electrical current to the sensor.

An output pathway is configured to communicate sensor data.

The coil is formed from a material selected from the group consisting of pure copper, copper alloys, and combinations thereof.

The core body is formed from a material selected from the group consisting of iron, nickel, cobalt, and combinations thereof.

The epoxy mixture includes a soft magnetic or paramagnetic material.

The soft magnetic or paramagnetic material is in the form of a powder or beads.

The soft magnetic material includes pure iron.

The controlled portion filled by the epoxy mixture ranges from about twenty-five percent to about one hundred percent of the fixed volume of the cavity.

The controlled portion filled by the epoxy mixture is two-thirds of the fixed volume of the cavity.

The coefficient of thermal expansion of the epoxy mixture and the core body is the same.

A method of tuning an inductance of an inductive sensor includes filling a core body cavity having a fixed volume with an epoxy mixture. The epoxy mixture includes an epoxy material and a magnetic material, and fills a controlled portion of the fixed volume. The controlled portion controls the inductance of the sensor.

The method of the preceding paragraph can optionally include, additionally and/or alternatively, any one or more of the following features, configurations and/or additional components:

The method includes adding a sealant to the cavity.

The method includes filling between about twenty-five percent and about one hundred percent of the fixed volume of the cavity with the epoxy mixture.

The method includes filling two thirds of the fixed volume of the cavity with the epoxy mixture.

The method includes adding a diamagnetic material to the cavity.

The magnetic material comprises a soft magnetic material.

The magnetic material comprises a paramagnetic material.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of tuning an inductance of an inductive sensor, the method comprising:
   determining a desired inductance of the sensor;
   achieving the desired inductance by:
      partially filling a core body cavity with a first mixture, the first mixture comprising an epoxy material and a magnetic material; and
      further filling the core body cavity with a second mixture different from the first mixture, the second mixture being situated proximate and distinct from the first mixture;
   wherein the cavity has a fixed volume; and
   wherein the first mixture fills a controlled portion of the fixed volume that is less than the fixed volume, the controlled portion controlling the inductance of the sensor.

2. The method of claim 1 and further comprising: adding a sealant to the cavity.

3. The method of claim 1 and further comprising: filling two-thirds of the fixed volume of the cavity with the first mixture.

4. The method of claim 1, wherein the second mixture comprises a diamagnetic material.

5. The method of claim 1, wherein the magnetic material comprises a soft magnetic material.

6. The method of claim 1, wherein the magnetic material comprises a paramagnetic material.

7. The method of claim 1, wherein the first mixture comprises an epoxy paste with magnetic particles mixed into the epoxy paste.

* * * * *